United States Patent [19]

De Cecco et al.

[11] 3,897,286

[45] July 29, 1975

[54] METHOD OF ALIGNING EDGES OF EMITTER AND ITS METALIZATION IN A SEMICONDUCTOR DEVICE

[75] Inventors: Angelo L. De Cecco, Newtown Square; Robert E. Hysell, Berwyn; Dante E. Piccone, Philadelphia, all of Pa.

[73] Assignee: General Electric Company, Philadelphia, Pa.

[22] Filed: June 21, 1974

[21] Appl. No.: 481,733

[52] U.S. Cl. ........................ 156/11; 156/17; 357/38

[51] Int. Cl. ............................................. H01l 7/50

[58] Field of Search .............. 357/38; 117/212, 217; 148/1.5, 187, 186; 29/571, 576, 580; 156/3, 156/8, 11, 13, 17, 22; 252/79.2

[56] References Cited

UNITED STATES PATENTS

| | | | |
|---|---|---|---|
| 2,956,913 | 10/1960 | Mack et al. | 148/1.5 |
| 3,566,517 | 3/1971 | Brown et al. | 29/571 |
| 3,703,408 | 11/1972 | Belasco et al. | 117/212 |

*Primary Examiner*—William A. Powell
*Attorney, Agent, or Firm*—J. Wesley Haubner; Albert S. Richardson, Jr.; Joseph H. Yamaoka

[57] ABSTRACT

In making a thyristor, the outer face of the N-type emitter layer and an adjoining surface of the P-type base layer of a semiconductor wafer are metalized, a limited zone of metal overlapping the edge of the emitter-base junction is removed, and then the entire portion of the emitter layer exposed by the removed metal is etched away.

18 Claims, 5 Drawing Figures

METHOD OF ALIGNING EDGES OF EMITTER AND ITS METALIZATION IN A SEMICONDUCTOR DEVICE

This invention relates generally to the process of making a multilayer semiconductor switching device, and more particularly it relates to an improved method of making a high power, multi-diffused, silicon controlled rectifier (known generally as a thyristor or SCR) having a turn-on *di/dt* rating.

Typically a power thyristor comprises a thin, broad area disc-like body having four distinct layers of semiconductor material (preferably silicon), with contiguous layers being of different conductivity types to form three back-to-back PN (rectifying) junctions in series. To the outer surfaces of the respective end layers of the silicon body a pair of main current-carrying metallic contacts or electrodes (anode and cathode) are conductively joined in low-resistance ohmic contact therewith, and the body is normally equipped with at least one control contact or electrode (gate) for triggering conduction between these main electrodes. To complete the device the silicon body is sealed in an insulating housing, and it can be externally connected to associated electric power and control circuits by means of its main and control electrodes.

A thyristor that is connected in series with a load impedance and a source of voltage will ordinarily block appreciable current flow between its anode and cathode when forward voltage is applied in the absence of a control signal. To turn on the thyristor, a small gate current of suitable magnitude and duration is supplied to its control electrode while the main electrodes are forward biased (anode potential positive with respect to cathode), whereupon the device abruptly switches from a high resistance off state to a very low resistance, forward conducting state. Once triggered in this manner, the thyristor will continue to conduct until load current is subsequently reduced below a given holding level, whereupon the device reverts to its blocking (turned off) state.

During the turn on process, the rate at which anode current rises is known as the inrush current slope, or *di/dt*. To increase the *di/dt* ability of a high power thyristor, it is a known practice in the art to use a so-called pilot or amplifying gate structure. In accordance with this practice, a relatively small auxiliary region of the N-type end layer of the silicon wafer (which layer is called the emitter) is disposed between the gate contact and the main emitter region from which it is separated by a gap. The auxiliary region of the emitter is isolated from the cathode, and a metallic pilot contact on its outer surface extends to an adjacent surface of the P-type base layer which is exposed in the aforesaid gap. The auxiliary region is dimensioned and located in relation to the main region of the emitter so that the initial anode current that traverses the auxiliary region when the thyristor is triggered constitutes a high energy turn on signal for the main portion of the device. See reissue patent U.S. Pat. No. Re. 27,440—DeCecco et al. In high-current or high-frequency thyristors of this kind, the pilot contact is so arranged that the high energy turn on signal is uniformly distributed along an appreciable length of the adjacent border of the main emitter region, whereby this signal triggers a relatively large area of the main region. Since the main emitter region will start conducting anode current in the area triggered by the high energy turn on signal, this area is hereinafter referred to as the turn on line. See U.S. Pat. No. 3,577,046—Moyson for further information regarding the theory and construction of amplifying gate thyristors.

When an off-state thyristor is subjected to rapidly rising forward bias voltage, it is prone to turn on in the *dv/dt* mode. To improve the *dv/dt* withstand ability of all-diffused thyristors, it is a known practice in the art to use a "shorted emitter" construction. In accordance with this practice, the metallic electrode which serves as the cathode of the thyristor is also connected to the P-type base layer of the silicon wafer, thereby short circuiting the rectifying (PN) junction between this base layer and the contiguous N-type emitter. The basic shorted emitter construction, in which the cathode contact is extended beyond the compass of the emitter so as to provide an electroconductive path of low resistance across the peripheral edges of the emitter junction, is disclosed in U.S. Pat. No. 3,476,993—Aldrich et al. In order to prevent undesirable gate-cathode or pilot-cathode short circuits, such metallic shunts are customarily omitted from the portion of the emitter junction through which triggering current must flow to turn the device on, and toward this end it is desirable to set back the edge of the cathode with respect to the edge of the emitter near this portion of the junction. As a result, a small portion of the emitter in the vicinity of the turn-on line is left uncovered by the cathode. It has been found that this uncovered portion of the emitter layer can be the source of localized overheating during the turn-on process, thereby limiting the *di/dt* ability of the device. This problem would be avoided if the edge of the cathode were precisely aligned with the corresponding edge of the emitter next to the turn-on line, but in prior art practice such alignment has been difficult to obtain without risking unwanted shunts across the emitter junction in this vicinity. Accordingly, it is a general objective of this invention to provide an improved method of manufacturing a thyrister wherein an edge of the cathode can be easily and perfectly aligned with the edge of the emitter in the vicinity of the turn-on line.

In carrying out the invention in one form, a broad area wafer of semiconductor material is provided with four layers of alternately P and N conductivity types. One of the intermediate or base layers of the wafer has first and second laterally adjoining regions. The contiguous end layer, which is called the emitter, is relatively thin and is superimposed on the aforesaid first region of the base layer with which it forms a rectifying junction, and a metallic contact is then connected to its outer face. To avoid short circuiting the rectifying junction in the vicinity of the border between the first and second regions of the base layer, the metallic contact is omitted from a relatively small area of the outer face of the emitter layer in this vicinity. Then the entire portion of the emitter layer that was disposed under this area is removed by an etching technique or the like, thereby ensuring that the edge of the remainder of the emitter is perfectly aligned with the edge of the metallic contact adjacent to the rectifying junction.

The invention will be better understood and its various objects and advantages will be more fully appreciated from the following description taken in conjunction with the accompanying drawing in which.

Figure 1:
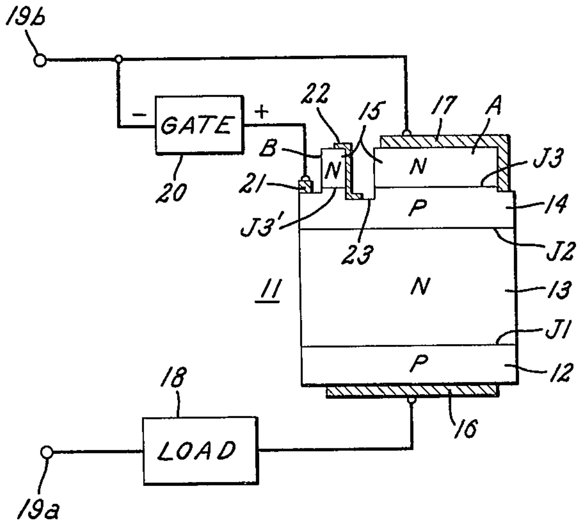
FIG. 1 is a schematic diagram of a prior art PNPN semiconductor switching device including amplifying gate and shorted emitter features, which device is shown connected in an electric circuit.

The PNPN semiconductor switching device shown schematically in FIG. 1 includes an asymmetrically conductive body 11 having four layers or zones 12, 13, 14, and 15 of semiconductor material arranged in succession between a pair of main current-carrying electrodes comprising metallic contacts 16 and 17. Contiguous layers of the semiconductor body are given different conductivity types so that their respective interface boundaries form three rectifying junctions J1, J2, and J3 in series between the main electrodes 16 and 17. The N-type end layer 15 is herein referred to as the emitter layer, and the rectifying junction J3 that it forms with the contiguous P-type base layer 14 is herein referred to as the emitter junction.

The main electrode 17 of the device 11 is disposed in broad area ohmic contact with the outer face of the emitter 15 and extends in short-circuiting relation across the peripheral edge of the emitter junction J3 into ohmic contact with the base layer 14. This electrode serves as the cathode of the device 11, and the companion main electrode 16, which makes low-resistance ohmic contact with the outer face of the P-type opposite end layer 12, serves as the anode. By means of these main electrodes, the device 11 is connected to an external electric current circuit comprising a load impedance 18, a source of voltage represented by the terminals 19a and 19b, and other conventional components (not shown) such as a series choke and a parallel snubber circuit which ordinarily are associated with the device. Impinging on the P-type base layer 14 there is a control electrode comprising a metallic contact 21, and a controlled source 20 of gate current is connected between this contact and the cathode 17 in order to trigger the device when conduction is desired.

As is shown in FIG. 1, the N-type emitter layer 15 of the device 11 is divided into a main region A and a smaller auxiliary region B which is laterally displaced with respect to the main region. The auxiliary emitter B is located between the gate contact 21 and the main emitter A, and it forms a rectifying junction J3′ with a contiguous region of the P-type base layer 14. A metallic pilot contact 22 overlies the outer face of this auxiliary emitter in low-resistance ohmic contact therewith, and the pilot contact 22 also extends across an edge of the junction J3′ into similar contact with the exposed surface of another region of the base layer 14 located between the main and auxiliary regions A and B of the emitter 15. However, the pilot contact 22 is not connected to the whole area of the surface of this base region, and between it and the main emitter junction J3 there is a gap or channel 23 which is free of contact with either the pilot contact 22 or the cathode 17. This is the above-referenced amplifying gate arrangement.

To complete a commercially practical thyristor, the device 11 should be enclosed in an hermatically sealed insulating housing of any known design, with its respective main and control electrodes 16, 17, and 21 being suitably connected to corresponding terminal members of the housing which members in turn are adapted to be connected to the illustrated external circuits by means of appropriate supporting and heat dissipating structure (not shown).

In operation, the thyristor 11 is triggered from a relatively high impedance, non-conducting state to a low impedance conducting state by energizing its gate contact 21 with a relatively small gate signal when its main electrodes are forward biased. This turns on the device under the auxiliary region B of the emitter layer 15, whereupon main current will flow in a path which includes the auxiliary emitter B, the pilot contact 22, a portion of the base layer 14 under the channel 23, and the region of the emitter junction J3 adjacent to the pilot contact. Main current having traversing the latter junction constitutes a peremptory trigger signal of relatively high energy for a broad area of the main emitter region A, and interelectrode current consequently starts flowing directly between the anode 16 and the cathode 17 along a predetermined turn-on line of the main emitter A. The turn-on line will effectively coincide with the border of the main emitter that is parallel and adjacent to the pilot contact.

By using the above-described structure, a high power thyristor capable of withstanding a peak voltage of at least 1,800 volts in its off state, of conducting an average forward current of more than 1,000 amperes in its on state, and of turning on with high *di/dt* ability can be controlled by a gate signal of the order of 100 milliamps and less than 5 volts.

The FIG. 1 view of the thyristor 11 is schematic and is not intended to be to scale. In practice the device will ordinarily comprise a very thin, broad area disc-like wafer of silicon whose outside diameter exceeds 1 inch and may, approach 2 inches or more. The P layers 12 and 14 and the N layer 15 are formed in the originally N-type wafer by diffusion techniques well known to those skilled in the art. The thicknesses or widths of all four layers are very small, typically 5.5, 10, 3.5, and 0.25 mils, respectively. The sheet resistance of the P-type base layer 14 at the emitter junction J3 is in the range of 300 to 3,000 ohms per square. The anode 16, the cathode 17, the gate contact 21, and the pilot contact 22 are thin layers of aluminum or the like. The anode 16 can be attached by an alloying process and is ordinarily backed by a rugged substrate of tungsten (not shown). The cathode 17 and the pilot contact 22, which are only about 0.5 mil thick, are applied by an evaporation technique or other suitable process which avoids counter-doping the N-type emitter layer 15.

Figure 2:
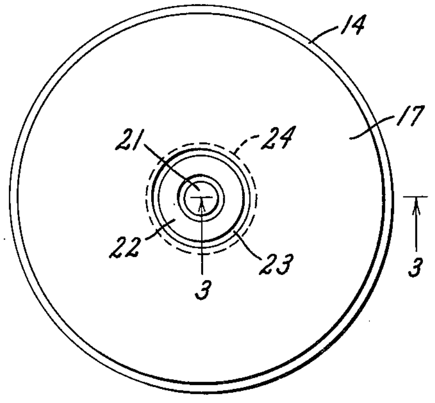
FIG. 2 is a plan view of a prior art device which has an annular form of amplifying gate.

A practical form of the amplifying gate is illustrated in FIG. 2. Here the pilot contact 22 is seen to have an annular configuration, as does the auxiliary region of the emitter which it overlies. Preferably the gate contacts 21 is located in the center of the wafer where it is circumscribed by the auxiliary emitter, and the auxiliary emitter in turn is surrounded by the main emitter region and its associated main electrode 17, both of which are annular in shape and concentric with the pilot contact 22. Consequently the trigger channel 23 between the pilot contact and the main emitter junction also has an annular configuration. As is depicted by the broken-line circle 24 in FIG. 2, the turn-on line of the main emitter in this embodiment will effectively coincide with the inside perimeter thereof. The length of this turn-on line 24 is desirably long, for example nearly 1.5 inches in a wafer whose diameter is 2 inches.

Preferably the cathode 17 of the device 11 not only contacts a peripheral area of the P-type base layer 14 beyond the compass of the main region of the N-type emitter layer but also makes ohmic contact with a plurality of small discrete areas of the base layer spread over substantially the whole of the main emitter region, thereby providing a plurality of metallic shunts across the emitter junction J3. As is well known to persons skilled in the art, the separate emitter shunts are usually distributed in a suitable pattern so that all pairs of adjacent shunts are spaced nearly equally from each other, whereby their density is substantially uniform. It is also well known that for proper turn-on action there should be no metallic shunts across the main emitter junction J3 at the edge of the trigger channel 23, and the same proscription applies at the inside perimeter of the auxiliary emitter junction J3' where gate current needs to flow to initiate the turn-on process. Preferably the edge of the cathode 17 nearest to the trigger channel 23 will coincide precisely with the inside perimeter of the main emitter region, and the edge of the pilot contact 22 nearest to the gate contact 21 will similarly coincide with the inside perimeter of the auxiliary emitter region. The advantages of this configuration and an efficacious way to obtain it in accordance with our invention will now be described with reference to FIGS. 3–5.

Figure 3:
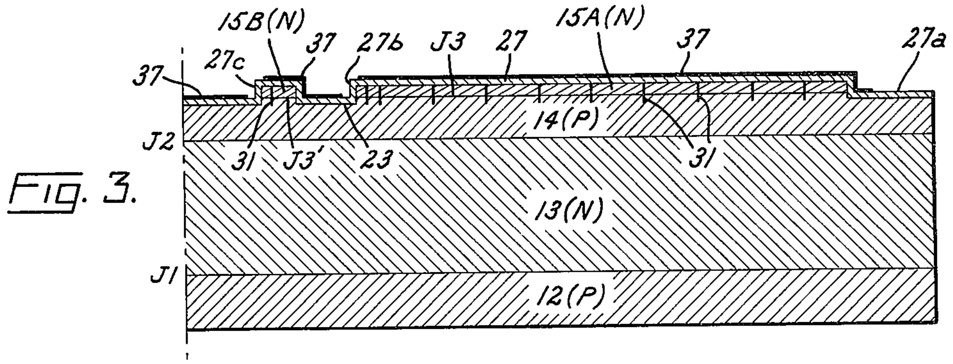
FIG. 3 is an enlarged sectional view of one-half of a device similar to the one shown in FIG. 2 showing the device during a stage of its manufacture after its emitter has been patterned and metalized but before the metalization is patterned.

In FIG. 3, which is an enlarged sectional view of the right half of a device similar to the one illustrated in FIG. 2, the device is shown at an intermediate stage during its manufacture. At this stage it is assumed that planar PN junctions J1, J2, and J3 (and J3') have been formed in the silicon wafer and that a thin layer 27 of metal (e.g., aluminum) has been applied over the outer faces of the main and auxiliary emitter regions 15A and 15B as well as over the surfaces of certain exposed regions of the contiguous base layer 14. The particular device illustrated in FIG. 3 is characterized by a mesa structure wherein the exposed regions of the base layer register with a predetermined pattern of apertures in the original emitter layer from which the N-type silicon has been removed by well known techniques such as photo resist masking and etching. After thus patterning the emitter layer, the whole top of the wafer is coated with the metal contact 27 by well known methods such as evaporation (i.e., vapor plating) and sintering. Portions 31 of the metal 27 penetrate a plurality of discrete channels which were etched out of the emitter layer, thereby shunting the emitter junction J3 (and J3') at a plurality of separate points.

Figure 4:
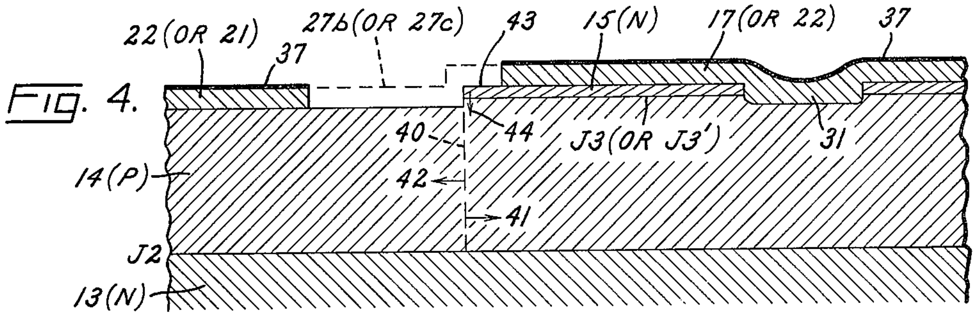
FIG. 4 is a further enlarged partial view of the device shown in FIG. 3 after its metalization has been patterned.

After metalizing the silicon wafer as described above, a layer or film 37 of suitable masking material (e.g., photo resist) is deposited by known techniques on the exterior of the metal layer 27 except for selected areas thereof. The areas from which the masking material is omitted overlie three limited zones of the metal layer: an annular zone 27*a* around the outer periphery of the wafer; another annular zone 27*b* which is in contact with the aforesaid trigger channel 23; and a third annular zone 27*c* disposed inboard with respect to the auxiliary emitter region 15B. The unmasked areas of the metal layer 27 are subsequently treated with a suitable metal etchant (e.g., a mixture of 5 parts concentrated nitric acid, 80 parts phosphoric acid, and 15 parts water) for a sufficient length of time to remove all of the metal in the limited zones 27*a*, 27*b*, and 27*c*. After this metalization patterning step, the profile of the semiconductor and metal layers in the vicinity of zone 27*b* (or 27*c*) will be as shown in enlarged FIG. 4.

in FIG. 4 it is apparent that the zone 27*b* (or 27*c*) of metal that was etched away had been disposed in overlapping relationship with the border 40 between two latterly adjoining regions of the base layer 14: a first region 41 which has an annular shape and on which the emitter layer 15 is superimposed; and a second region 42 which is circumscribed by the first region. Consequently the removal of this zone of metal not only exposes a predetermined surface area of the base layer extending along the outside perimeter of the second region 42 but also exposes a relatively small area 43 of the outer face of the emitter layer 15 adjacent to the border 40. The latter area, which extends all the way around the inside perimeter of the annular-shaped emitter, is defined by the edge of the masking material 37 which is set back a short radial distance (e.g., from 1 to 1.5 mils) from the corresponding edge of the emitter 15. The metal contact 17 (or 22) is removed or omitted from the area 43 to avoid short circuiting the edge of the rectifying junction J3 that emerges above the border 40. A mismatch exists between the edge of the mask 37 and the border 40 because of the practical difficulty of obtaining a perfect alignment therebetween.

The portion of lip of the emitter layer 15 that is disposed under the exposed area 43 is very thin (less than 0.5 mil) and has a relatively high lateral resistance. It has been found to have a detrimental effect on the *di/dt* performance of the device. If triggering current were to traverse the emitter junction J3 (or J3'), current would be injected at the emitter edge, as indicated by the pointer 44 in FIG. 4, and the emitter lip would therefore introduce a high resistance segment in the current path between the turn-on line and the metal contact 17. Due to the aforesaid alignment difficulties, the length of this segment and its series resistance are not constant from one location to another along the turn-on line. This can result in non-uniform turn-on action. In addition, the resistance drop in the emitter lip can cause localized overheating which degrades the *di/dt* ability of the device.

Figure 5:
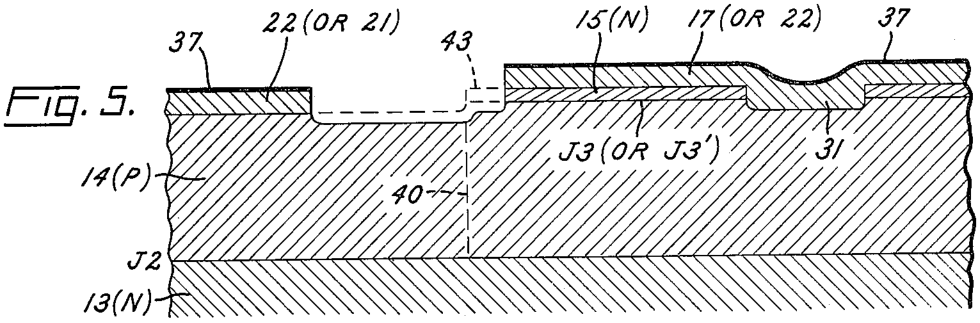
FIG. 5 is a view similar to FIG. 4 showing the device after the step in its manufacturing which embodies the present invention.

In accordance with our invention, there is added to the manufacturing process of the device a relatively simple but highly useful step of removing entirely the portion of the emitter layer 15 disposed under the aforesaid area 43. This additional step takes place after the above-described metalization patterning, and it is preferably performed by bathing or treating the area 43 with a suitable semiconductor etchant (e.g., a mixture of nitric and hydrofluoric acids) for a sufficient length of time to remove entirely the portion of the emitter layer that was disposed under the area 43. A time of 25 seconds is sufficient to remove silicon to a depth of approximately one-third mil. During this step the exposed surface of the second region 42 of the base layer adjacent to the area 43 is simultaneously treated by the same etchant, thereby harmlessly etching away some of this region too. After this step, the profile of the semiconductor layers in the gap between the metallic contacts 17 and 22 (or 22 and 21) will be as shown in FIG. 5.

Preferably the last-mentioned step is performed prior to removing or stripping the layer of masking material 37 from the metal contacts 17 and 22, whereby this material serves to mask the contacts from the semiconductor etchant. However, if desired the masking material 37 can be earlier removed, in which case the metallic contacts themselves would serve as a mask for the semiconductor material thereunder, as is sometimes done in the IG-FET art (see U.S. Pat. No. 3,566,517—Brown et al). No significant amount of metal would be removed during the relatively brief time required to etch out the very thin portion of the emitter 15 under the area 43. As is clearly shown in FIG. 5, the edge of the metallic contact 17 (or 22) is perfectly aligned with the corresponding edge of the emitter layer 15 in the vicinity of the border 40, and as a result the above-described variable series resistance and overheating effects are avoided.

While a preferred form of the invention has been shown and described by way of example, many modifications will occur to those skilled in the art. For example, all conductivity types and polarities shown in the drawing could be reversed. The thyristor could be provided with a side gate instead of (or in addition to), the center gate, in which case the turn-on line would effectively coincide with at least part of the outer perimeter of the main emitter region. Instead of an annular shape, the pilot contact could have a hexagonal or other shape, or it could be interdigitated. Either visible or invisible light could be used as the gate current source. The invention could be embodied in a device without an amplifying gate structure. Furthermore, it could be embodied in a device having a planar type construction instead of the mesa type that has been herein described. Therefore the claims which conclude this specification are intended to cover all such modifications as fall within the true spirit and scope of the invention.

What we claim as new and desire to secure by Letters Patent of the United States is:

1. In a method of making a semiconductor device including a broad area, multi-layer semiconductor wafer comprising at least a base layer having first and second laterally adjoining regions of one conductivity type and a thin emitter layer of a different conductivity type superimposed on said first region of the base layer with which it forms a rectifying junction, the improvement comprising the steps of:

a. connecting a metallic contact to the outer face of said emitter layer except for a relatively small area of said face, adjacent to at least part of the border between said first and second regions of said base layer, from which said contact is omitted to avoid short circuiting said rectifying junction in the vicinity of said border; and then b. removing entirely the portion of said emitter layer that was disposed under said area.

2. The improved method of claim 1 in which said last-mentioned step is performed by treating said area of said outer face of said emitter layer with a semiconductor etchant for a sufficient length of time to remove entirely said portion of said emitter layer.

3. The improved method of claim 1 in which said last-mentioned step is performed by treating said area of said outer face of said emitter layer and an exposed surface of said second region of said base layer adjacent to said area with a semiconductor etchant for a sufficient length of time to remove entirely said portion of said emitter layer.

4. The method of claim 1 in which both base and emitter layers are diffused in said semiconductor wafer.

5. The method of claim 4 in which said first region of said base layer has a sheet resistance at said rectifying junction in the range of 300 to 3,000 ohms per square.

6. The method of claim 5 in which said emitter layer is less than 0.5 mil thick.

7. The method of claim 5 in which said emitter layer is a mesa structure and said rectifying junction is planar.

8. The method of claim 1 in which said first region of said base layer has an annular shape and circumscribes said second region, said emitter layer has an annular shape, and said area of said outer face of said emitter layer extends around the inside perimeter of said emitter layer.

9. In a method of making a semiconductor device including a broad area, multi-layer semiconductor wafer comprising at least a base layer having first and second latterly adjoining regions of one conductivity type and a thin emitter layer of a different conductivity type superimposed on said first region of the base layer with which it forms a rectifying junction, the improvement comprising the steps of:

a. applying a layer of metal to the outer face of said emitter layer and to the surface of said second region of said base layer;

b. removing a limited zone of said metal layer overlapping at least part of the border between said first and second regions of said base layer, thereby exposing predetermined areas of the outer face of said emitter layer and of the surface of said second region adjacent to said border; and then c. removing entirely the portion of said emitter layer that was disposed under the predetermined exposed area of its outer face.

10. The improved method of claim 9 in which said lastmentioned step is performed by treating said predetermined areas with a semiconductor etchant for a sufficient length of time to remove entirely said portion of said emitter layer.

11. The improved method of claim 9 in which said limited zone of said metal layer is removed by the steps of:

a. depositing a layer of masking material on the exterior of said metal layer except for an area overlying said limited zone, and then b. treating the unmasked area of said metal layer with a metal etchant for a sufficient length of time to remove all of the metal in said limited zone.

12. The improved method of claim 11 in which the step of removing the portion of said emitter layer under said predetermined area of the outer face thereof is performed by treating said predetermined area with a semiconductor etchant for a sufficient length of time to remove entirely said portion of said emitter layer.

13. The improved method of claim 12 including the additional step of removing said layer of masking material after the step of removing the portion of said emitter layer under said predetermined area.

14. The method of claim 9 in which both base and emitter layers are diffused in said semiconductor wafer.

15. The method of claim 14 in which said first region of said base layer has a sheet resistance at said rectifying junction in the range of 300 to 3,000 ohms per square.

16. The method of claim 15 in which said emitter layer is less than 0.5 mil thick.

17. The method of claim 15 in which said emitter layer is a mesa structure and said rectifying junction is planar.

18. The method of claim 9 in which said first region of said base layer has an annular shape and circumscribes said second region, said predetermined exposed area of the surface of said second region extends along the outside perimeter of said second region, said emitter layer has an annular shape, and said predetermined exposed area of the outer face of said emitter layer extends around the inside perimeter of said emitter layer.

* * * * *